United States Patent
Yoshida et al.

(10) Patent No.: US 7,148,562 B2
(45) Date of Patent: Dec. 12, 2006

(54) POWER SEMICONDUCTOR DEVICE AND POWER SEMICONDUCTOR MODULE

(75) Inventors: Takanobu Yoshida, Fukuoka (JP); Shinji Hatae, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 210 days.

(21) Appl. No.: 10/872,481

(22) Filed: Jun. 22, 2004

(65) Prior Publication Data

US 2005/0093123 A1   May 5, 2005

(30) Foreign Application Priority Data

Oct. 31, 2003   (JP) .............................. 2003-371786

(51) Int. Cl.
| H01L 23/495 | (2006.01) |
| H01L 23/52 | (2006.01) |
| H01L 23/34 | (2006.01) |
| H01L 23/498 | (2006.01) |

(52) U.S. Cl. .................. 257/675; 257/676; 257/691; 257/706; 257/E23.051; 257/723; 257/E23.075

(58) Field of Classification Search ........ 257/675–676, 257/691, 706, 723, E23.075, E23.051
See application file for complete search history.

(56) References Cited

U.S. PATENT DOCUMENTS

| 5,345,107 | A | * | 9/1994 | Daikoku et al. ............ 257/717 |
| 5,767,573 | A | * | 6/1998 | Noda et al. .................. 257/675 |
| 6,278,199 | B1 | * | 8/2001 | Grant et al. ............... 307/10.1 |
| 6,703,707 | B1 | * | 3/2004 | Mamitsu et al. ............ 257/718 |
| 6,914,321 | B1 | * | 7/2005 | Shinohara .................... 257/678 |
| 6,933,593 | B1 | * | 8/2005 | Fissore et al. .............. 257/675 |
| 6,972,958 | B1 | * | 12/2005 | Mayer ........................ 361/719 |
| 6,979,909 | B1 | * | 12/2005 | Shinohara ................... 257/796 |

FOREIGN PATENT DOCUMENTS

| JP | 60-224256 | 11/1985 |
| JP | 02-78265 | 3/1990 |
| JP | 08-191130 | 7/1996 |
| JP | 10-116959 | 5/1998 |

* cited by examiner

Primary Examiner—Luan Thai
(74) Attorney, Agent, or Firm—McDermott Will & Emery LLP (57) ABSTRACT

A plurality of power semiconductor chips (power transistors or the like) are arranged, being separated from each other with a free space of a terminal board interposed therebetween. A radiating block is in contact with an insulating layer (a package and grease below the terminal board) below an arrangement region of each of the power semiconductor devices and a region between power semiconductor devices, and this increases a heat dissipation effect. With this construction, it is possible to provide a power semiconductor device and a power semiconductor module which ensure an excellent dissipation effect of heat radiated in operation of the power semiconductor chips.

7 Claims, 6 Drawing Sheets

POWER SEMICONDUCTOR DEVICE AND POWER SEMICONDUCTOR MODULE

BACKGROUND OF THE INVENTION

1. Field of the Invention

The present invention relates to a power semiconductor device including power semiconductor chips and a power semiconductor module on which the power semiconductor device is mounted.

2. Description of the Background Art

A power semiconductor chip which functions as a thyristor, an IGBT (Insulated Gate Bipolar Transistor) or the like is obtained by selectively forming p-type and n-type impurity regions in a semiconductor substrate. The power semiconductor chip which is thus obtained is connected to a terminal board with lead portions, or the like and covered with a resin-sealed package, together with the terminal board or the like, to become a power semiconductor device.

The followings are among prior-art documents on such a power semiconductor device.

[Patent Document 1] Japanese Patent Application Laid Open Gazette No. 60-224256.

[Patent Document 2] Japanese Patent Application Laid Open Gazette No. 2-78265.

[Patent Document 3] Japanese Patent Application Laid Open Gazette No. 8-191130.

[Patent Document 4] Japanese Patent Application Laid Open Gazette No. 10-116959.

For example, FIGS. 1 and 2 of Patent Document 1 show thyristor chips 3 and 4. A power semiconductor chip, such as the thyristor chips 3 and 4, radiates heat in its operation, but Patent Document 1 gives no consideration on the heat radiation in operation.

FIGS. 1 and 2 of Patent Document 2 show a case where a plurality of power semiconductor chips in four to six pairs each consisting of two chips are mounted on a circuit component mounting portion 25. In the constitution, however, a plurality of power semiconductor chips in pairs of two are arranged closely to one another and therefore are susceptible to an ill effect of heat radiated from one another. Specifically, when one of the pair of power semiconductor chips has a high heating value, for example, there is a possibility that the heat radiation may increase the operating temperature of the other chip. Therefore, it can be said that Patent Document 2 also gives no consideration on heat radiation in operation.

None of Patent Documents 1 to 4 discusses heat radiation in a case where a plurality of power semiconductor devices on which the power semiconductor chips are mounted are collected in module.

In consideration of the above circumstances, the present invention is intended to provide a power semiconductor device and a power semiconductor module for improving a dissipation effect of heat radiated in operation of the power semiconductor chips.

SUMMARY OF THE INVENTION

It is an object of the present invention to provide a power semiconductor device and a power semiconductor module capable of producing an excellent dissipation effect of heat which is radiated in operation of power semiconductor chips.

According to a first aspect of the present invention, a power semiconductor device includes a conductive terminal board, a plurality of power semiconductor chips, an insulating layer and a radiating block. The conductive terminal board has a front surface and a back surface. The plurality of power semiconductor chips are arranged on the front surface of the terminal board. The insulating layer is disposed on the back surface of the terminal board. The radiating block is in contact with the insulating layer and is insulated from the terminal board with the insulating layer interposed therebetween. The plurality of power semiconductor chips are arranged, being separated from one another with a free space of the terminal board interposed between adjacent two. The radiating block is in contact with the insulating layer and the insulating layer is in contact with the back surface of the terminal board at least below respective arrangement regions of the plurality of power semiconductor chips and respective regions between the plurality of power semiconductor chips.

The plurality of power semiconductor chips are arranged, being separated from one another with the free space of the terminal board interposed between adjacent two chips. This allows the terminal board to absorb heat radiated from the power semiconductor chips not only in a portion thereof below the arrangement region of each power semiconductor chip but also in a portion thereof between the power semiconductor chips and thereby improves a dissipation effect of heat from the power semiconductor chips. Further, separated from one another, the plurality of power semiconductor chips are less susceptible to an ill effect of heat radiated from one another. Furthermore, the radiating block is in contact with the insulating layer and the insulating layer is in contact with the back surface of the terminal board at least below respective arrangement regions of the plurality of power semiconductor chips and respective regions between the plurality of power semiconductor chips. This allows the radiating block to absorb heat from the terminal board through the insulating layer also in a portion between the power semiconductor chips and thereby improves a heat dissipation effect.

According to a second aspect of the present invention, a power semiconductor module includes a radiating block and a plurality of power semiconductor devices. The radiating block has a front surface. The plurality of power semiconductor devices each includes at least one power semiconductor chip and a package covering the at least one power semiconductor chip. The plurality of power semiconductor devices are arranged on the front surface of the same radiating block.

Since the plurality of power semiconductor devices are arranged on the front surface of the same radiating block, it is possible to efficiently dissipate the heat radiated from the plurality of power semiconductor devices through one radiating block. In this case, arranging the plurality of power semiconductor devices very closely allows size reduction of the whole power semiconductor module, and arranging the plurality of power semiconductor devices separately from one another allows the plurality of power semiconductor devices to be less susceptible to an ill effect of heat radiated from one another. Further, the plurality of power semiconductor devices are arranged on the front surface of one radiating block, the power semiconductor module of the present invention needs less work for attaching the plurality of power semiconductor devices to the radiating block as compared with a case where the plurality of power semiconductor devices are attached to respective radiating blocks and connected to one another.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

The first preferred embodiment is a power semiconductor device having a construction in which a plurality of power semiconductor chips are arranged, being separated from one another with a free space of a terminal board interposed between adjacent two of the power semiconductor chips and a radiating block is in contact with an insulating layer and the insulating layer is in contact with a back surface of the terminal board below an arrangement region of each chip and each region between the chips, which improves a heat dissipation effect.

Figure 1:
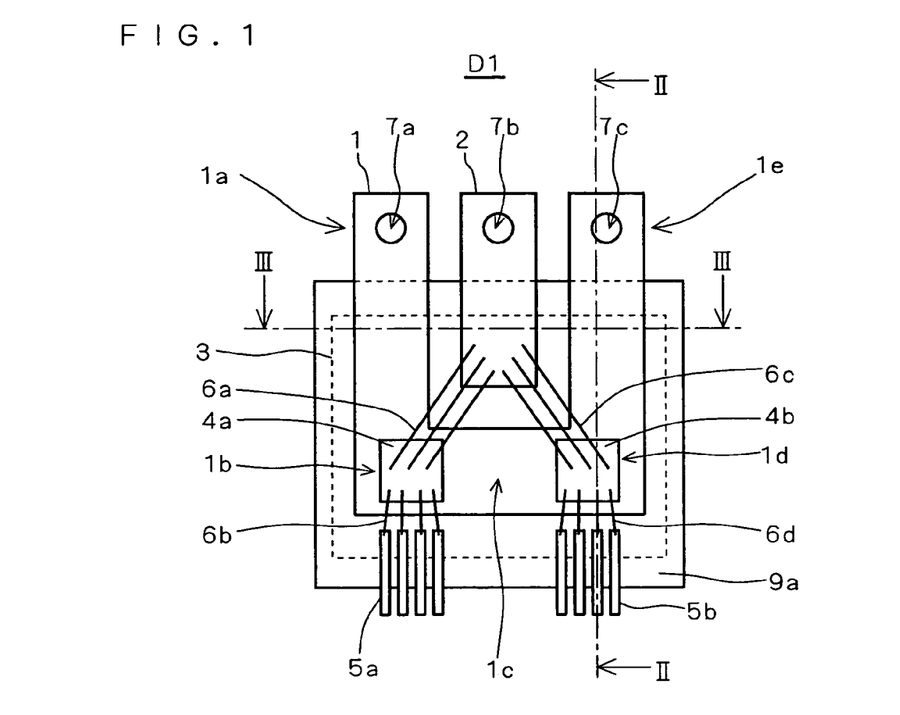
FIG. 1 is a plan view showing a power semiconductor device in accordance with a first preferred embodiment.
Figure 2:
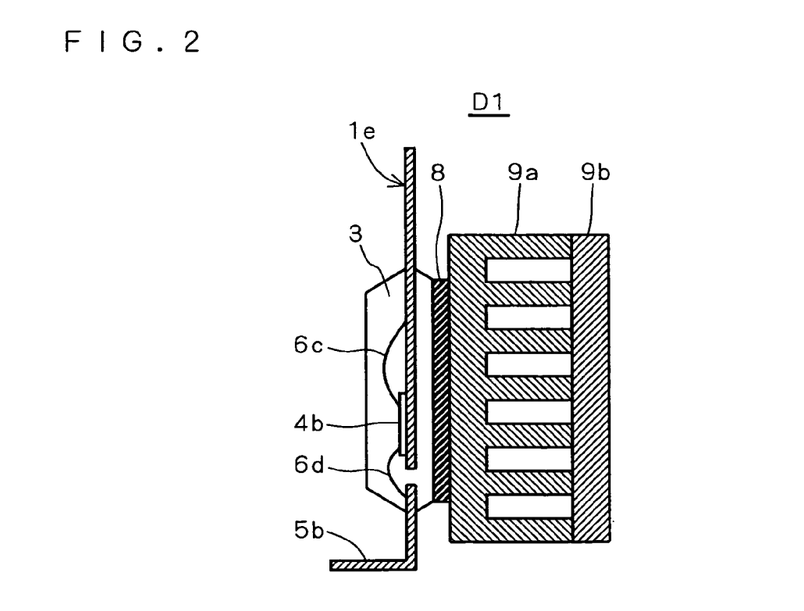
FIG. 2 is a cross section showing the power semiconductor device in accordance with the first preferred embodiment.
Figure 3:
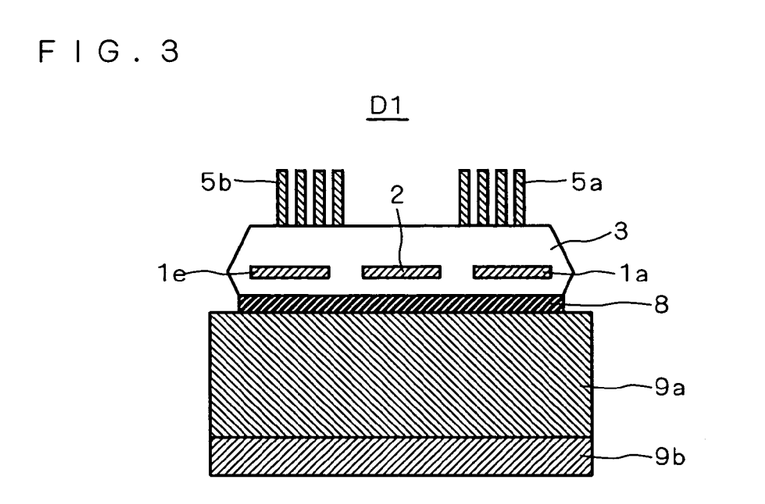
FIG. 3 is another cross section showing the power semiconductor device in accordance with the first preferred embodiment.

FIG. 1 is a plan view showing a semiconductor device D1 in accordance with the first preferred embodiment. FIG. 2 is a cross section taken along the section line II—II of FIG. 1 and FIG. 3 is a cross section taken along the section line III—III of FIG. 1.

As shown in FIG. 1, the semiconductor device D1 comprises a plurality of power semiconductor chips 4a and 4b, such as power transistors. In the semiconductor device D1 of FIG. 1, for example, each front surface of the power semiconductor chips 4a and 4b is provided with an emitter of the power transistor which functions as one main current electrode and each back surface is provided with a collector of the power transistor which functions as the other main current electrode. A region of each front surface other than the emitter is provided with a base of the power transistor which functions as a control electrode.

The semiconductor device D1 comprises conductive terminal boards 1 and 2 made of aluminum or the like. The terminal boards 1 and 2 are each a flat board.

The terminal board 1 is substantially U-shaped, having lead portions 1a and 1e for establishing electric connection with the outside, bends 1b and 1d of the U shape and a bottom 1c of the U shape. The lead portions 1a and 1e are provided with connection holes 7a and 7c for electric connection with the outside, respectively. The power semiconductor chips 4a and 4b are disposed near the bends 1b and 1d of the terminal board 1, respectively. In the other words, the power semiconductor chips 4a and 4b are disposed, being separated from each other with the bottom 1c of the U-shaped terminal board 1 as a free space interposed therebetween. For attachment of the power semiconductor chips 4a and 4b to the terminal board 1, back surfaces of the power semiconductor chips 4a and 4b (for example, the collectors of the power transistors) are bonded to a front surface of the terminal board 1 with a conductive material such as solder (not shown).

The terminal board 2 has an "I" shape and is disposed between the lead portions 1a and 1e of the terminal board 1, being separated from the terminal board 1. The terminal board 2 is also provided with a connection hole 7b for electric connection with the outside. The main current electrodes (for example, the emitters of the power transistors) on front surfaces of the power semiconductor chips 4a and 4b are electrically connected to a front surface of the terminal board 2 with conductive materials such as bonding wires 6a and 6c.

The semiconductor device D1 also comprises conductive control signal terminals 5a and 5b made of aluminum or the like. The control electrodes (for example, the bases of the power transistors) on the front surfaces of the power semiconductor chips 4a and 4b and front surfaces of the control signal terminals 5a and 5b are electrically connected to each other with the conductive materials such as bonding wires 6b and 6d.

The semiconductor device D1 also comprises an insulative resin-sealed package 3 covering part of the terminal boards 1 and 2, the power semiconductor chips 4a and 4b, part of the control signal terminals 5a and 5b and the bonding wires 6a to 6d.

As shown in FIGS. 2 and 3, a lower surface of the resin-sealed package 3 is bonded to a radiating block 9a and 9b with insulative grease 8 interposed therebetween. The radiating block 9a and 9b has a constitution in which a slit part 9a having a plurality of slits and a cover part 9b are bonded to each other.

In the first preferred embodiment, a lower-side region of the resin-sealed package 3 and the grease 8 serve as an insulating layer between the terminal boards 1 and 2 and the control signal terminals 5a and 5b and radiating block 9a and 9b. Specifically, the insulating layer consisting of the lower-side region of the resin-sealed package 3 and the grease 8 is disposed on the back surfaces of the terminal boards 1 and 2 and the control signal terminals 5a and 5b, and the terminal boards 1 and 2 and the control signal terminals 5a and 5b are insulated from the radiating block 9a and 9b with the insulating layer interposed therebetween.

Then, the radiating block 9a and 9b is in contact with the insulating layer consisting of the lower-side region of the resin-sealed package 3 and the grease 8 and the insulating layer is in contact with the back surfaces of the terminal boards 1 and 2 and the control signal terminals 5a and 5b below respective arrangement regions of the power semiconductor chips 4a and 4b, a region between the power semiconductor chips 4a and 4b (the bottom 1c of the U-shaped terminal board 1) and regions of the terminal board 1 which extend to the lead portions 1a and 1e.

In the power semiconductor device of the first preferred embodiment, a plurality of power semiconductor chips 4a and 4b are arranged, being separated from each other with the bottom 1c of the U-shaped terminal board 1 as a free space interposed therebetween. This allows the terminal board 1 to absorb heat radiated from the power semiconductor chips 4a and 4b not only in a portion thereof below the arrangement regions of the power semiconductor chips 4a and 4b but also in a portion thereof between the power semiconductor chips 4a and 4b and thereby improves heat radiation of the power semiconductor chips 4a and 4b.

Separated from each other, the power semiconductor chips 4a and 4b are less susceptible to an ill effect of heat radiated from each other. Further, the radiating block 9a and 9b is in contact with the insulating layer consisting of the lower-side region of the resin-sealed package 3 and the grease 8 and the insulating layer is in contact with the back surface of the terminal board 1 at least below the arrangement regions of the power semiconductor chips 4a and 4b and the region between the power semiconductor chips 4a and 4b. This allows the radiating block 9a and 9b to absorb the heat from the terminal board 1 even in the portion thereof between the power semiconductor chips 4a and 4b through the insulating layer consisting of the lower-side region of the resin-sealed package 3 and the grease 8 and thereby improves a heat dissipation effect.

In this discussion, a case where the two power semiconductor chips 4a and 4b are provided is taken as an example, but if it is intended to provide more power semiconductor chips, the power semiconductor chips are arranged, being separated from one another with a free space of the terminal board 1 interposed between adjacent two chips. Then, it is only necessary to have a construction where the radiating block 9a and 9b is in contact with the insulating layer consisting of the lower-side region of the resin-sealed package 3 and the grease 8 and the insulating layer is in contact with the back surface of the terminal board 1 below the respective arrangement regions of a plurality of power semiconductor chips and respective regions between the power semiconductor chips.

Further, in the power semiconductor device of the first preferred embodiment, the terminal board 1 includes the lead portions 1a and 1e for establishing electric connection with the outside and even below the regions of the terminal board 1 which extend to the lead portions 1a and 1e, the radiating block 9a and 9b is in contact with the insulating layer consisting of the lower-side region of the resin-sealed package 3 and the grease 8 and the insulating layer is in contact with the back surface of the terminal board 1. This allows the radiating block 9a and 9b to absorb the heat from the terminal board 1 through the insulating layer consisting of the lower-side region of the resin-sealed package 3 and the grease 8 even below the regions of the terminal board 1 extending to the lead portions 1a and 1e.

Furthermore, in the power semiconductor device of the first preferred embodiment, the terminal board 1 is a flat board. Therefore, it is possible to suppress an increase in thickness of the power semiconductor device which is caused by providing the radiating block 9a and 9b.

<The Second Preferred Embodiment>

The second preferred embodiment is a variation of the power semiconductor device of the first preferred embodiment and adopts a T-shaped terminal board and I-shaped terminal boards instead of the terminal boards 1 and 2 of the first preferred embodiment.

Figure 4:
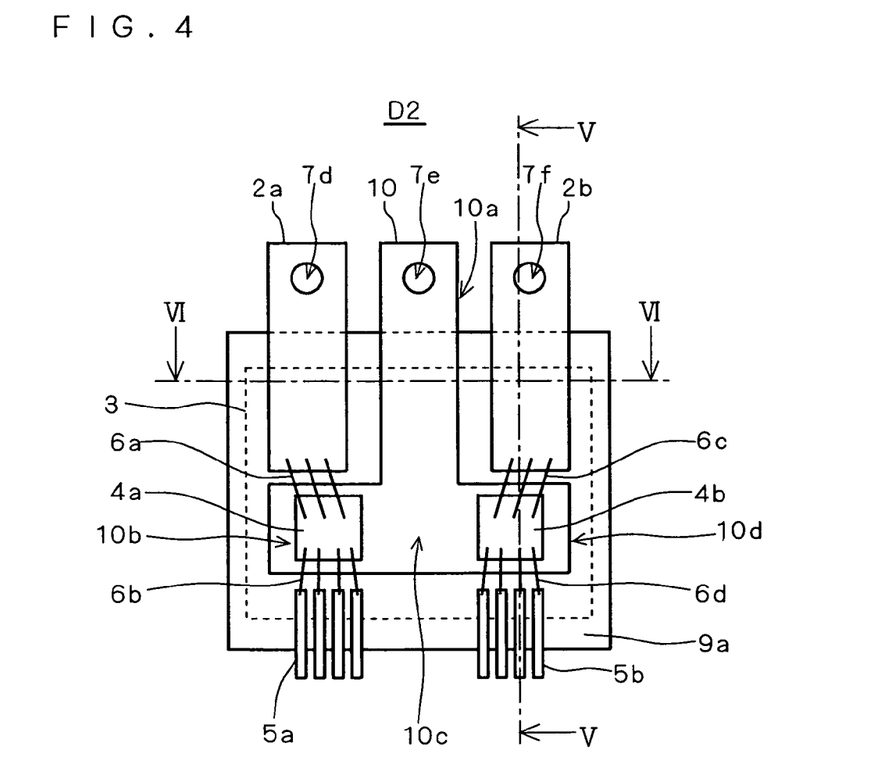
FIG. 4 is a plan view showing a power semiconductor device in accordance with a second preferred embodiment.
Figure 5:
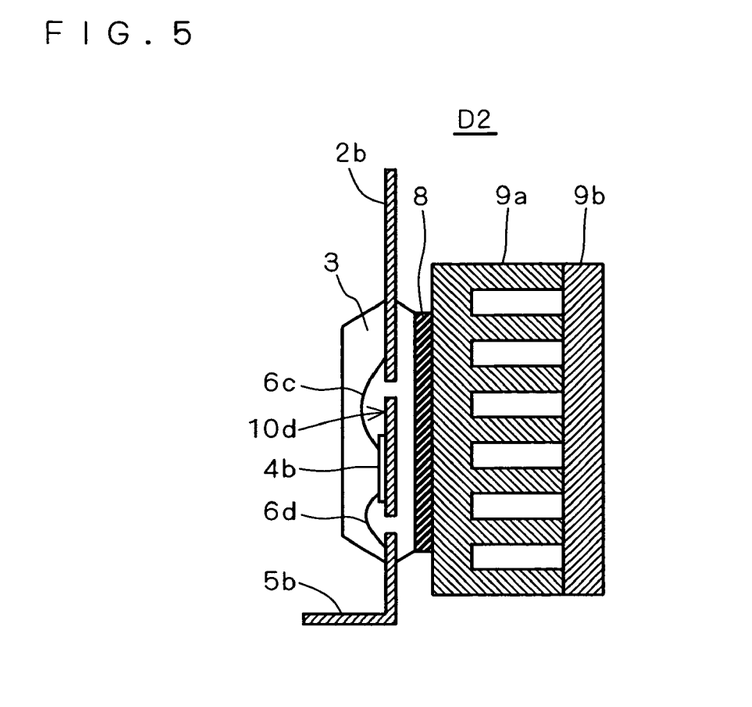
FIG. 5 is a cross section showing the power semiconductor device in accordance with the second preferred embodiment.
Figure 6:
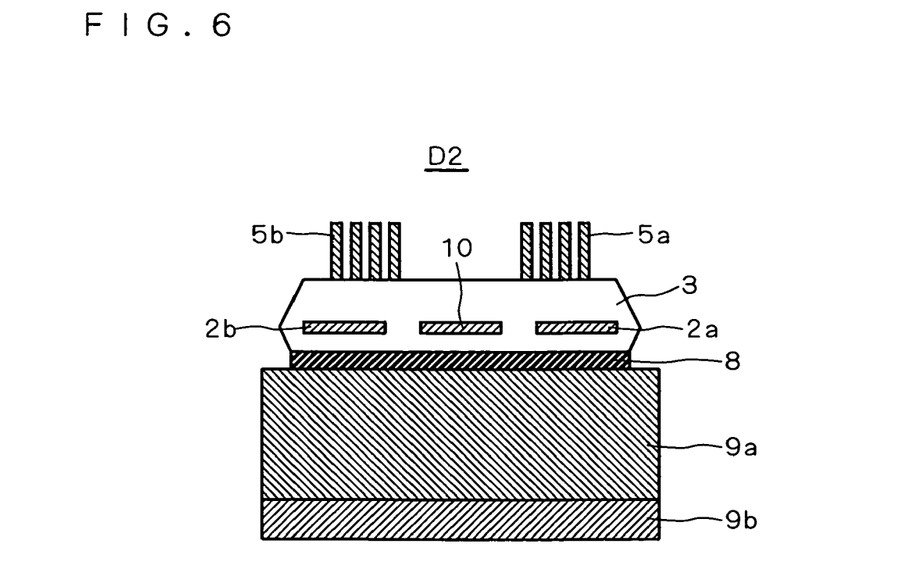
FIG. 6 is another cross section showing the power semiconductor device in accordance with the second preferred embodiment.

FIG. 4 is a plan view showing a semiconductor device D2 in accordance with the second preferred embodiment. FIG. 5 is a cross section taken along the section line V—V of FIG. 4 and FIG. 6 is a cross section taken along the section line VI—VI of FIG. 4.

As shown in FIG. 4, the semiconductor device D2 comprises conductive terminal boards 10, 2a and 2b made of aluminum or the like. The terminal boards 10, 2a and 2b are each also a flat board, like the terminal boards 1 and 2.

The terminal board 10 is T-shaped, having a lead portion 10a for establishing electric connection with the outside, wing portions 10b and 10d of the T shape and a connection portion 10c of the T shape. The lead portion 10a is provided with a connection hole 7e for electric connection with the outside. The power semiconductor chips 4a and 4b are disposed near the wing portions 10b and 10d of the T-shaped terminal board 10, respectively. Specifically, the power semiconductor chips 4a and 4b are disposed, being separated from each other with the connection portion 10c of the T-shaped terminal board 10 as a free space interposed therebetween. For attachment of the power semiconductor chips 4a and 4b to the terminal board 10, the back surfaces of the power semiconductor chips 4a and 4b (for example, the collectors of the power transistors) are bonded to a front surface of the terminal board 10 with a conductive material such as solder (not shown).

The terminal boards 2a and 2b each have an "I" shape and are so disposed as to sandwich the lead portion 10a of the terminal board 10, being away therefrom. The terminal boards 2a and 2b are also provided with connection holes 7d and 7f for electric connection with the outside, respectively. The main current electrodes on the front surfaces of the power semiconductor chips 4a and 4b (for example, the emitters of the power transistors) are electrically connected to front surfaces of the terminal boards 2a and 2b with conductive materials such as the bonding wires 6a and 6c, respectively.

Constituent elements in the power semiconductor device of the second preferred embodiment other than those described above are the same as those in the power semiconductor device of the first preferred embodiment and description thereof will be omitted.

In the power semiconductor device of the second preferred embodiment, the lead portion 10a of the terminal board 10 extends outwardly from a region between the power semiconductor chips 4a and 4b. Therefore, the lead portion 10a can absorb the heat radiated from the power semiconductor chips 4a and 4b on both sides and dissipate it outside, and thereby produces an excellent heat dissipation effect. Further, since the lead portion 10a absorbs the heat radiated from the power semiconductor chips 4a and 4b on both sides, the power semiconductor chips 4a and 4b are less susceptible to an ill effect of heat radiated from each other.

In this discussion, a case where the two power semiconductor chips 4a and 4b are provided is taken as an example, but if it is intended to provide more power semiconductor chips, the lead portion of the terminal board 10 extends outwardly from a region of each power semiconductor chip.

<The Third Preferred Embodiment>

The third preferred embodiment is a power semiconductor module using the power semiconductor devices of the first and second preferred embodiments.

Figure 7:
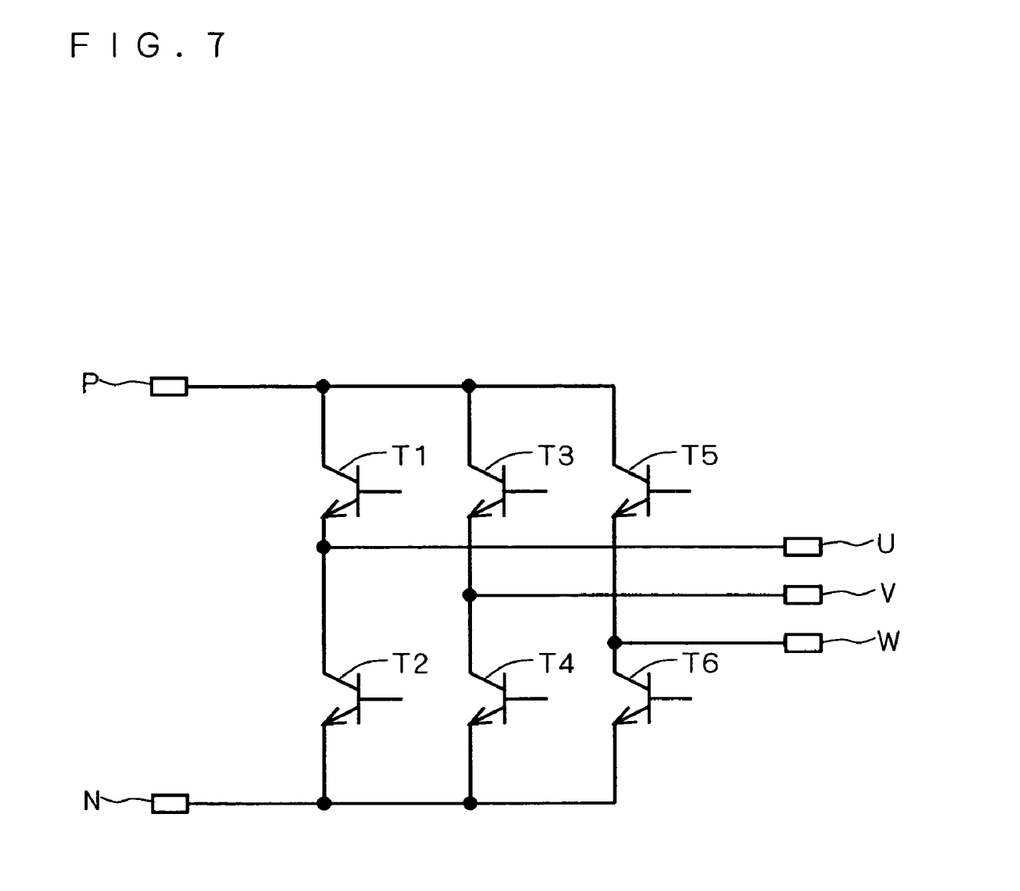
FIG. 7 is a circuit diagram showing a power semiconductor module in accordance with a third preferred embodiment.
Figure 8:
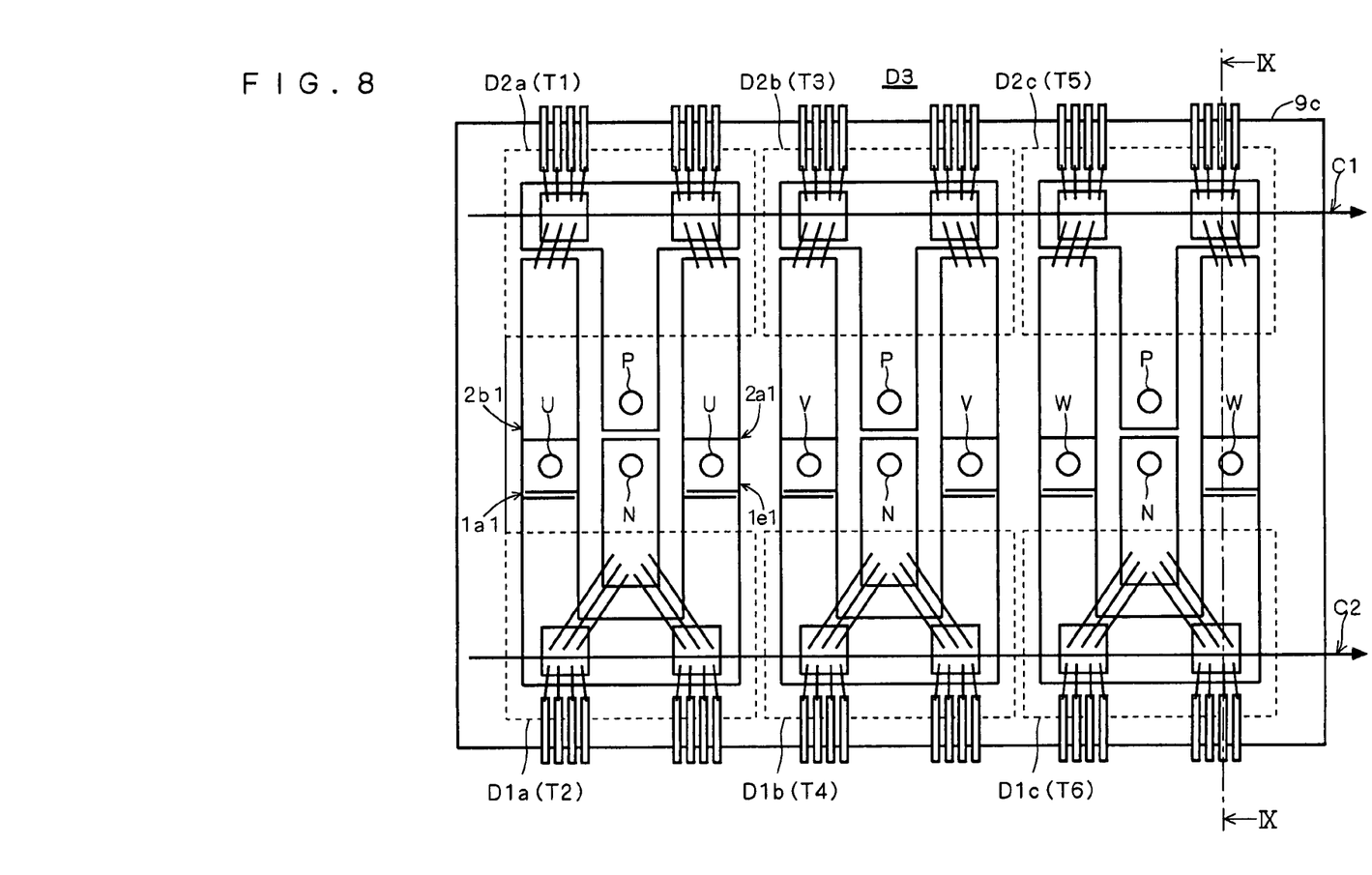
FIG. 8 is a plan view showing the power semiconductor module in accordance with the third preferred embodiment.
Figure 9:
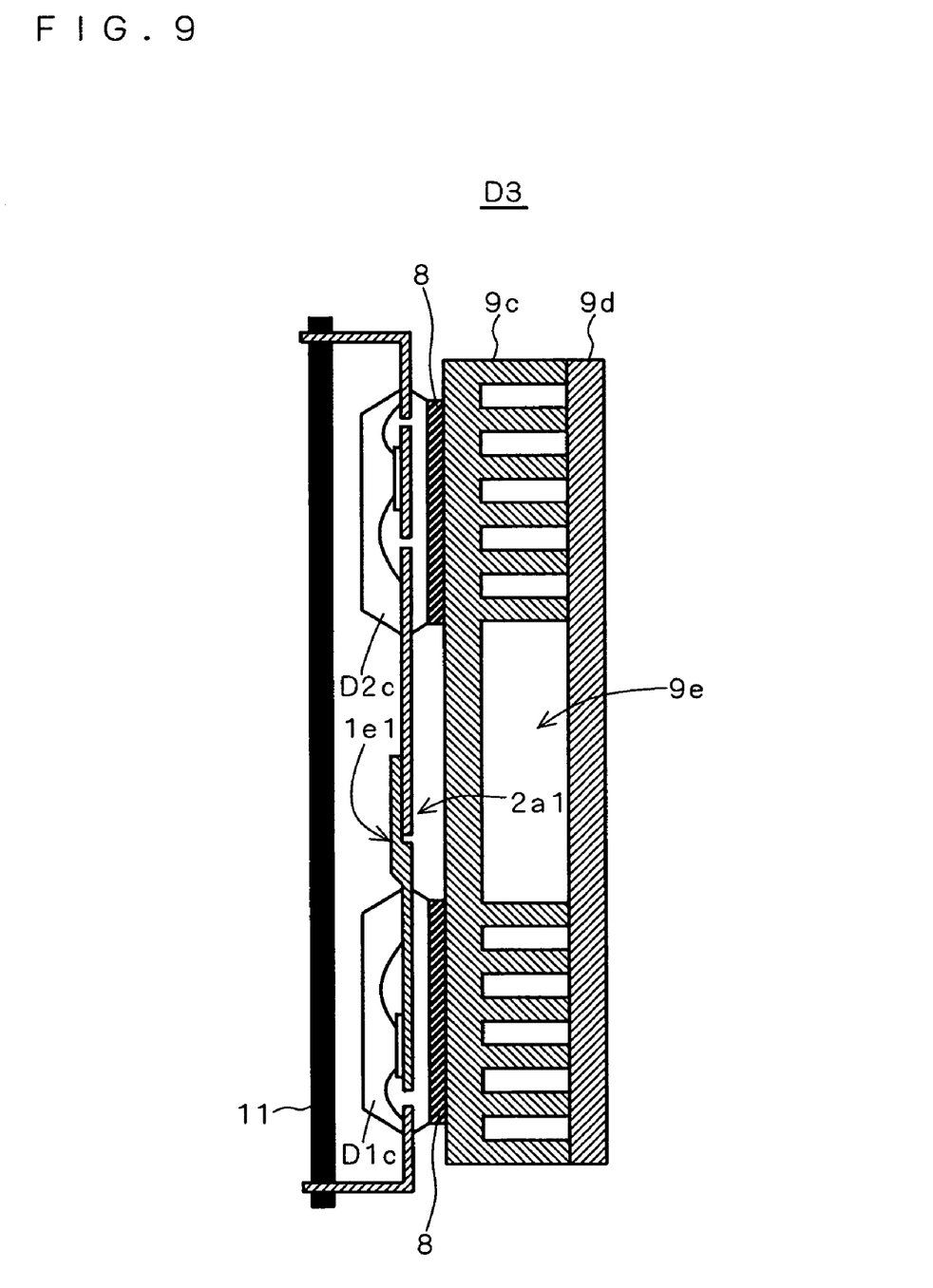
FIG. 9 is a cross section showing the power semiconductor module in accordance with the third preferred embodiment.

FIG. 7 is a circuit diagram showing a power semiconductor module D3 in accordance with the third preferred embodiment. FIG. 8 is a plan view showing the power semiconductor module D3 in accordance with the third preferred embodiment. FIG. 9 is a cross section taken along the section line IX—IX of FIG. 8.

As shown in FIG. 7, the power semiconductor module D3 of the third preferred embodiment is a three-phase inverter using six power transistors T1 to T6. Collectors of the power transistors T1, T3 and T5 are connected to in common a terminal P, and emitters of the power transistors T2, T4 and T6 are connected in common to a terminal N. An emitter of the power transistor T1 and a collector of the power transistor T2 are connected in common to a terminal U. An emitter of the power transistor T3 and a collector of the power transistor T4 are connected in common to a terminal V. An emitter of the power transistor T5 and a collector of the power transistor T6 are connected in common to a terminal W.

The power semiconductor module D3 of the third preferred embodiment, as shown in FIGS. 8 and 9, comprises power semiconductor devices D1a to D1c having substantially the same constitution as the power semiconductor device of the first preferred embodiment and power semiconductor devices D2a to D2c having substantially the same constitution as the power semiconductor device of the second preferred embodiment, as the power transistors T1 to T6.

The power semiconductor devices D1a to D1c and D2a to D2c, however, do not each comprise the radiating block 9a and 9b but are disposed on a surface of common radiating block 9c and 9d with the grease 8 interposed therebetween. The radiating block 9c and 9d has a constitution in which a slit part 9c having a plurality of slits and a cover part 9d are bonded to each other. In the slit part 9c, a gap 9e is provided between a row where the power semiconductor devices D1a to D1c are aligned and a row where the power semiconductor devices D2a to D2c are aligned.

The power semiconductor module D3 also comprises a control substrate 11 for supplying a control signal to a control signal terminal as shown in FIG. 9 (the control substrate 11 is not shown in FIG. 8 for clearly showing the power semiconductor devices D1a to D1c and D2a to D2c).

The power semiconductor devices D1a to D1c are each provided with steps 1a1 and 1e1 in the lead portions. In each of the power semiconductor devices D2a to D2c, side lead portions have extension portions 2a1 and 2b1 and are longer than a center lead portion. In each of the facing power semiconductor devices D1a and D2a, D1b and D2b and D1c and D2c, respective outer portions from the steps 1a1 and 1e1 are in contact with the extension portions 2b1 and 2a1, respectively, as shown in FIG. 9.

Constituent elements in the power semiconductor module of the third preferred embodiment other than those described above are the same as those in the power semiconductor devices of the first and second preferred embodiments and description thereof will be omitted.

Each of the center lead portions of the power semiconductor devices D1a to D1c corresponds to the terminal N of FIG. 7 and each of the center lead portions of the power semiconductor devices D2a to D2c corresponds to the terminal P of FIG. 7. Each of the side lead portions of the power semiconductor devices D1a and D2a corresponds to the terminal U of FIG. 7, each of the side lead portions of the power semiconductor devices D1b and D2b corresponds to the terminal V of FIG. 7 and each of the side lead portions of the power semiconductor devices D1c and D2c corresponds to the terminal W of FIG. 7.

The power semiconductor module D3 of the third preferred embodiment comprises a plurality of power semiconductor devices D1a to D1c and D2a to D2c sharing the radiating block 9c and 9d, each of which has at least one power semiconductor chip and a package covering it, and the power semiconductor devices D1a to D1c and D2a to D2c are disposed on the surface of the radiating block 9c and 9b. Therefore, the heat radiated from a plurality of power semiconductor devices D1a to D1c and D2a and D2c can be efficiently dissipated by one radiating block 9c and 9d.

In this case, arranging a plurality of power semiconductor devices very closely, like the arrangement of the power semiconductor devices D1a to D1c (or the power semiconductor devices D2a to D2c), allows size reduction of the whole power semiconductor module, and arranging a plurality of power semiconductor devices separately from one another, like the arrangement of the power semiconductor devices D1a and D2a (or the power semiconductor devices D1b and D2b, D1c and D2c), allows the plurality of power semiconductor devices to be less susceptible to an ill effect of heat radiated from one another.

Since a plurality of power semiconductor devices D1a to D1c and D2a and D2c are disposed on one radiating block 9c and 9d, the power semiconductor module of the third preferred embodiment needs less work for attaching the plurality of power semiconductor devices to the radiating block as compared with a case where the plurality of power semiconductor devices are attached to respective radiating blocks and connected to one another.

In the power semiconductor module D3 of the third preferred embodiment, the power semiconductor devices D1a to D1c are arranged along a line C2 on the surface of the radiating block 9c and 9d and the power semiconductor devices D2a to D2c are arranged along a line C1 in parallel to the line C2 on the surface of the radiating block 9c and 9d.

By adopting such a linear arrangement, in a case where cooling pipes (for example, water pipes for cooling) are provided on the power semiconductor devices D1a to D1c and D2a to D2c along the line C1 and C2, the number of bend portions (curve portions) of the cooling pipes decreases. Therefore, it is possible to reduce the total amount of friction loss in the bend portions of the cooling pipes when a coolant is carried in each of the cooling pipes. This allows cooling of a plurality of power semiconductor devices with higher energy efficiency.

In the power semiconductor module D3 of the third preferred embodiment, some power semiconductor devices D1a to D1c out of a plurality of power semiconductor devices are arranged along the line C2 and the other power semiconductor devices D2a to D2c are arranged along the line C1.

By providing a wide space between a row of some power semiconductor devices D1a to D1c out of a plurality of power semiconductor devices and another row of the other power semiconductor devices D2a to D2c, the power semiconductor devices D1a to D1c and the power semiconductor devices D2a to D2c can be made less susceptible to an ill effect of heat radiated from each other.

Further, in the power semiconductor module D3 of the third preferred embodiment, the radiating block 9c and 9d has the gap 9e below the region between the power semiconductor devices D1a to D1c and the power semiconductor devices D2a to D2c.

Therefore, it is possible to ensure weight reduction of the radiating block 9c and 9d and cost reduction through reduction in cost for the material.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor module, comprising:
a radiating block having a front surface; and
a plurality of power semiconductor devices, wherein said plurality of power semiconductor devices are arranged on said front surface of the same radiating block, said plurality of power semiconductor devices each comprise:
a conductive terminal board having a front surface and a back surface;
a plurality of power semiconductor chips arranged on said front surface of said terminal board; and
an insulating layer disposed on said back surface of said terminal board,
wherein in each of said plurality of power semiconductor devices,
said radiating block is in contact with said insulating layer so as to be insulated from said terminal board with said insulating layer interposed therebetween,
said plurality of power semiconductor chips are arranged to be separated from one another with a free space of said terminal board interposed between adjacent two, and
said radiating block is in contact with said insulating layer and said insulating layer is in contact with said back surface of said terminal board at least below respective arrangement regions of said plurality of power semiconductor chips and respective regions between said plurality of power semiconductor chips.

2. The power semiconductor module according to claim 1, wherein
said plurality of power semiconductor devices are arranged along at least one line on said front surface of said radiating block.

3. The power semiconductor module according to claim 2, wherein
said at least one line includes a plurality of parallel lines,
some of said plurality of power semiconductor devices are arranged along one of said plurality of parallel lines, and
the other of said plurality of power semiconductor devices are arranged along another one of said plurality of parallel lines.

4. The power semiconductor module according to claim 3, wherein
said radiating block has a gap below a region between said some of said plurality of power semiconductor devices and said other of said plurality of power semiconductor devices.

5. The power semiconductor module according to claim 1, wherein
said terminal board includes a lead portion for establishing electric connection with the outside, and
said radiating block is in contact with said insulating layer and said insulating layer is in contact with said back surface of said terminal board also below a region of said terminal board which extends to said lead portion.

6. The power semiconductor module according to claim 5, wherein said lead portion extends outwardly from a region between adjacent two of said plurality of power semiconductor chips.

7. The power semiconductor module according to claim 1, wherein said terminal board is a flat board.

* * * * *